United States Patent
Verghese et al.

(10) Patent No.: US 7,844,438 B1
(45) Date of Patent: Nov. 30, 2010

(54) METHOD TO ANALYZE AND CORRECT DYNAMIC POWER GRID VARIATIONS IN ICS

(75) Inventors: Nishath Verghese, Sunnyvale, CA (US); Kenneth Tseng, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 654 days.

(21) Appl. No.: 10/857,033

(22) Filed: May 28, 2004

Related U.S. Application Data (60) Provisional application No. 60/474,711, filed on May 29, 2003.

(51) Int. Cl.
G06F 17/50 (2006.01)

(52) U.S. Cl. ............................................. 703/14; 716/5

(58) Field of Classification Search .................. 703/14, 703/3, 4, 13, 15, 18; 716/5–7; 324/73.1, 324/765, 763, 158.1
See application file for complete search history.

(56) References Cited

U.S. PATENT DOCUMENTS

| | | | | |
|---|---|---|---|---|
| 5,553,008 A * | 9/1996 | Huang et al. | | 703/14 |
| 5,566,083 A * | 10/1996 | Fang | | 703/4 |
| 5,696,694 A * | 12/1997 | Khouja et al. | | 716/5 |
| 5,946,475 A * | 8/1999 | Burks et al. | | 716/6 |
| 6,134,513 A * | 10/2000 | Gopal | | 703/14 |
| 6,345,379 B1 * | 2/2002 | Khouja et al. | | 716/4 |
| 6,405,348 B1 * | 6/2002 | Fallah-Tehrani et al. | | 716/4 |
| 6,446,016 B1 * | 9/2002 | Zhu | | 702/69 |
| 6,509,785 B2 * | 1/2003 | Ang et al. | | 327/538 |
| 6,523,154 B2 * | 2/2003 | Cohn et al. | | 716/6 |
| 6,577,992 B1 * | 6/2003 | Tcherniaev et al. | | 703/14 |
| 6,807,660 B1 * | 10/2004 | Frenkil | | 716/6 |
| 6,898,769 B2 * | 5/2005 | Nassif et al. | | 716/5 |
| 6,976,235 B2 * | 12/2005 | Bobba et al. | | 716/7 |
| 2003/0144825 A1 * | 7/2003 | Korobkov | | 703/14 |
| 2003/0212538 A1 * | 11/2003 | Lin et al. | | 703/14 |

OTHER PUBLICATIONS

Ghosh et al., "Estimation of average switching activity in combinational and sequential circuits", 1992 IEEE.*

(Continued)

*Primary Examiner*—Kidest Bahta
*Assistant Examiner*—Carlos Ortiz-Rodriguez
(74) *Attorney, Agent, or Firm*—Vista IP Law Group LLP (57) ABSTRACT

A method to analyze and correct dynamic power grid variations in an IC includes performing a dynamic power grid analysis of the circuit, identifying an excessive dynamic power grid voltage fluctuation from the analysis, and modifying the circuit to reduce the excessive dynamic power grid fluctuation.

30 Claims, 8 Drawing Sheets

OTHER PUBLICATIONS

Massoud Pedram, "Power Minimization in IC Design Principles and Applications", ACM Transactions on Design Automation of Electronic Systems, vol. 1, No. 1, Jan. 1996, pp. 3-56.*

Alberto Nannarelli, "Power Evaluation Tool", 1996 Compass User's Group Conference, San Jose, CA, Apr. 1996.*

Irvin, David, "Basic Engineering Circuit Analysis", Fifth edition, 1996 Prentice-Hall. Chapters 4-10.*

G. Bai et al., "Simulation and Optimization of the Power Distribution Network in VLSI Circuits", 2000 IEEE.*

Aloul, A. et al. "Generic ILP versus Specialized 0-1 ILP: An Update" IEEE/ACM International Conference on Computer-Aided Design (ICCAD 2002), Nov. 10-14, 2002, pp. 450-457.

Arnoldi, W.E. "The Principle of Minimized Iteration in the Solution of the Matrix Eigenvalue Problem" Quarterly Applied Mathematics, 1951, vol. 9, pp. 17-29.

Moskewicz, M. et al. "Chaff: Engineering an Efficient SAT Solver" Proceedings of the Design Automation Conference, Jun. 2001, pp. 530-535.

* cited by examiner

Active clock net

METHOD TO ANALYZE AND CORRECT DYNAMIC POWER GRID VARIATIONS IN ICS

CROSS-REFERENCE TO RELATED APPLICATIONS

This application claims the benefit of U.S. Provisional Application No. 60/474,711, filed May 29, 2003, which is hereby incorporated by reference in its entirety.

FIELD OF THE INVENTION

The invention is related to the field of electronic circuit design.

BACKGROUND AND SUMMARY

Electronic design automation tools help a user to create and assess a design of an electronic system in terms of its functionality, performance, and cost. For example, a user can simulate an electronic circuit before it is built to determine if it will perform as intended. If it performs below its desired level, the user can modify the design to improve system performance.

One factor that can affect a circuit's performance is the circuit's power consumption characteristics. For example, due to the constant reduction in scaling of integrated circuit (IC) process technology, the size and power consumption of integrated circuits continues to increase significantly. The instantaneous power and current demands of modern integrated circuits can be so large that the on-chip power grid that distributes power to these circuits are taxed by excessive voltage and power losses. For example, the power drawn by a given node at a given instant may overwhelm the power supply. These instantaneous demands can adversely affect the performance of the IC to the point of failure. Conventional design tools fail to account for dynamic variations in the power grid of the IC.

A method to analyze and correct dynamic power grid variations in an IC includes performing a dynamic power grid analysis of the circuit, identifying an excessive dynamic power grid voltage fluctuation from the analysis, and modifying the circuit to reduce the excessive dynamic power grid fluctuation.

DETAILED DESCRIPTION

To remedy the problem of dynamic power grid variations in an integrated circuit (IC), decoupling capacitors are inserted between the on-chip power and ground grids of the IC. A decoupling capacitor acts as a local repository of charge that replenishes the charge drawn by a transistor or logic gate when it transitions from one logic state to another. To prevent large instantaneous currents from being drawn from the off-chip power supply and traversing the on-chip power grid, adequate amounts of decoupling capacitors are added throughout the power grid. One aim of adding decoupling capacitance is to minimize instantaneous voltage drop in the power grid to a small percentage (such as, for example, less than 10%) of the supply voltage rail. In order to reduce or minimize dynamic power grid variations, a dynamic power grid analysis is performed in the presence of decoupling capacitance to both determine an adequate amount of decoupling capacitance and to determine the locations to insert decoupling capacitors in order to reduce instantaneous power grid voltage fluctuation to a tolerable level.

Dynamic Power Grid Analysis and Correction Method

Figure 1:
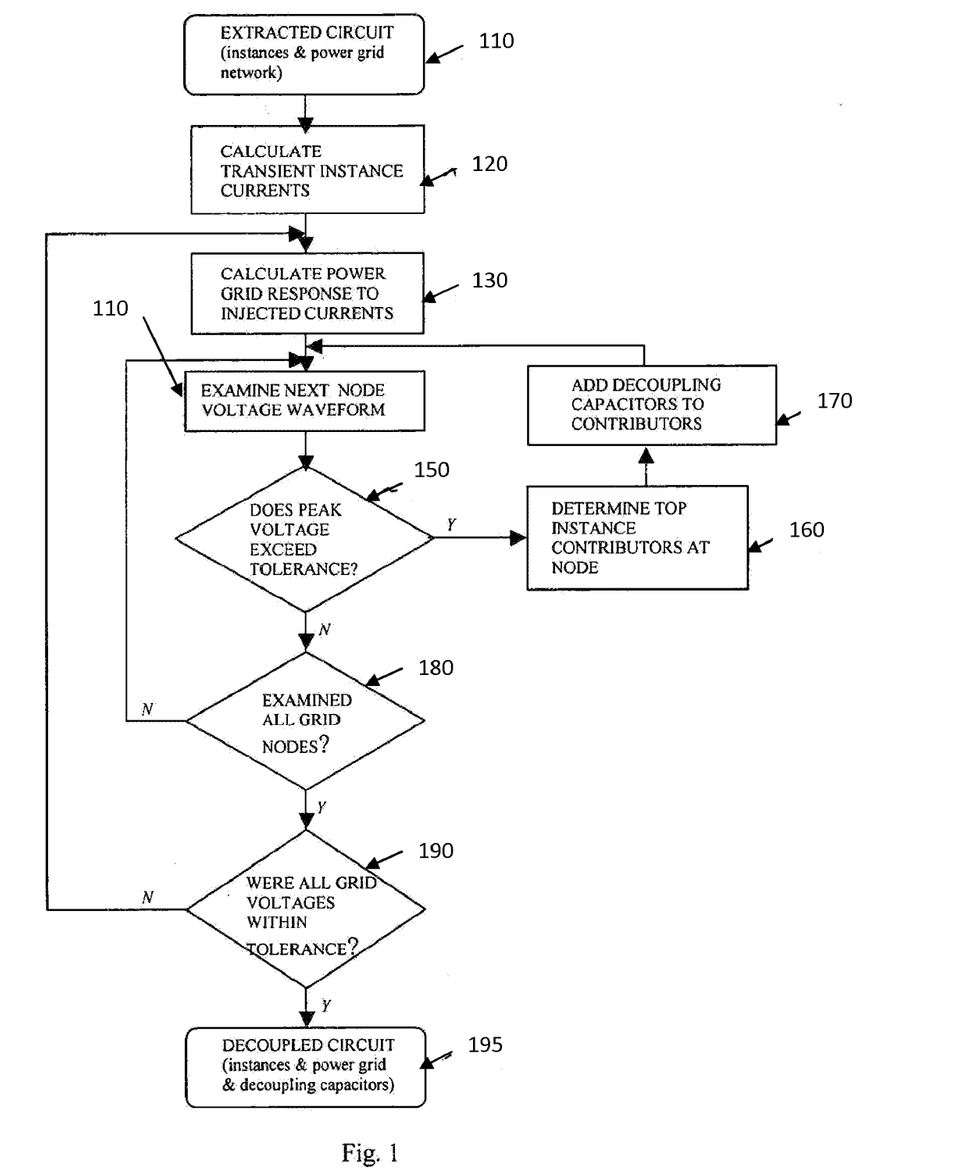
FIG. 1 shows an example of a method for analyzing and correcting dynamic power grid variations.

FIG. 1 shows an example of a method for analyzing and correcting dynamic power grid variations. An analysis device, such as a computer processing system for example, receives an extracted circuit having logic gate instances and the power grid network interconnecting these instances, 110. The extracted circuit is traversed starting from the primary inputs, and the instances are simulated in topological order to determine the transient current drawn from the power supply by each instance, 120. A satisfiable synchronous methodology, described below, is used to traverse the circuit and to setup the transient input stimuli for the simulation of each instance. Once the transient instance currents are determined, they are injected into the power grid network, and the resulting voltage response of the power grid network is calculated, 130. The peak to peak power grid voltage at each node in the network is then examined, 140, to determine if it exceeds a user-specified tolerance level, 150. If the voltage variation at a node is excessive, an adjoint calculation technique, described below, is used to determine the contribution of each instance current to the voltage variation at that node, 160. The top instance contributors for that node are determined and for each contributing instance, adequate decoupling capacitance is added between the corresponding power and ground rails, 170. Once the excessive node voltage variations have been addressed and requisite decoupling capacitors added, a re-examination of the power grid, 140 and 150, is performed to ensure that subsequent dynamic voltage variations are within the specified tolerance. If not, more decoupling capacitance is added and the analysis/correction loop 140, 150, 160, 170 continues until convergence with the tolerance is reached. After all grid nodes are examined, 180, the process determines if all grid voltages are within the specified tolerance, 190, and the decoupled circuit is output by the processing system, 195.

Transient Instance Current Calculation

Figure 2:
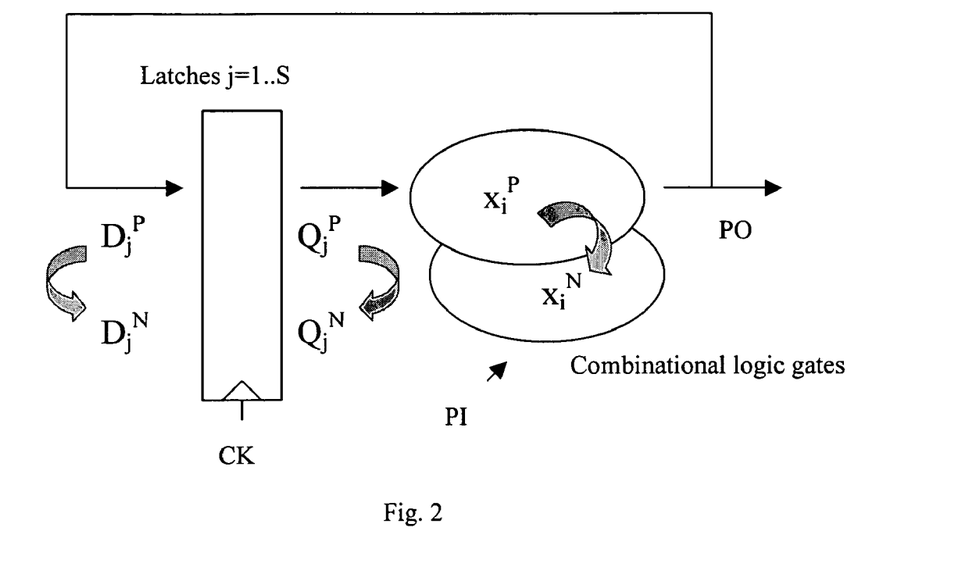
FIG. 2 shows an example of Boolean variables describing circuit states advancing from one clock cycle to next.

An aim of calculating the transient instance current, 120, is to determine the maximum instantaneous current drawn systematically from the power supplies when the logic circuit instances switch state. In a synchronous (clocked) design, a sizeable current dissipation occurs in a clock cycle when the clock net(s) are activated and the latch outputs switch state. Therefore, the method determines the circuit conditions that will result in the maximum number of latch outputs switching when the clock is asserted between two adjacent clock periods. To determine these circuit conditions, the Boolean logic for the circuit, as well as an optimization criterion, are formulated. Assuming a circuit with N nets comprising many combinational logic gates, each with a fanin of F, the Boolean logic may be represented as follows:

$$x_i^P = f(x_{i1}^P, \ldots, x_{iF}^P) \quad (a)$$

$$x_i^N = f(x_{i1}^N, \ldots, x_{iF}^N) \quad (b)$$

where $x_i^P$ and $x_i^N$ refer to the Boolean variable of net i in the previous and next clock cycles respectively, $i_1, \ldots, i_F \in N$, and each variable is a logic function $f$ of its fanin. The sequential logic transition between the two clock cycles is represented as:

$$Q_j^N = D_j^P \quad (c)$$

where $j=1, \ldots, S$ and S is the total number of latches in the circuit, with D and Q being the input and output of the latch respectively, as illustrated in FIG. 2, where the curved arrows indicate a cycle advance from previous to next cycle.

These three equations constrain the operation of the circuit in two adjacent clock cycles. In addition, an optimization criterion is specified that will result in the maximum number of simultaneously switching nets while satisfying the logic operation equations. The optimization criterion is written as:

$$\underset{i=1}{\overset{N}{\text{MAX}}} \; [c_i * (x_i^P \; XOR \; x_i^N)] \quad (d)$$

where $c_i$ represents the optimization cost. To ensure that the maximum number of latch outputs switch state, $c_i$ is set to 1 for all latch output nets and 0 for all other nets. The XOR condition enforces switching of logic level from the previous cycle to the next cycle on net i. The hazards are ignored in the above optimization criterion, because when a circuit simulation is run based on the generated 2-cycle setup (as described below), any hazard in the circuit and the resulting current consumption will be captured implicitly.

Figure 3:
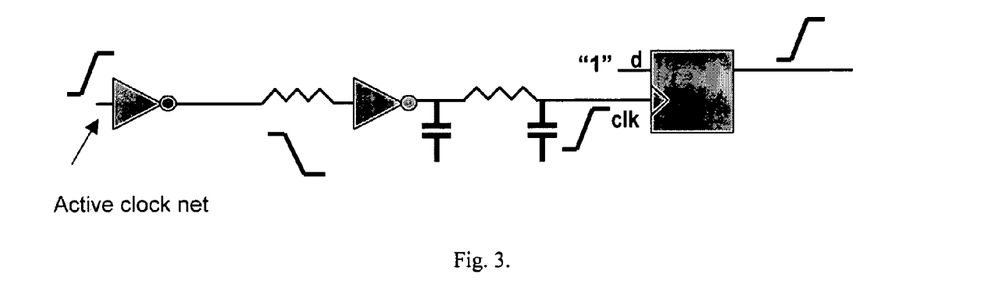
FIG. 3 shows an example of an active clock net that triggers the output of a latch to change state.

The above equations describe a weighted max-satisfiability problem. Recent algorithmic advances in Boolean satisfiability, as well as highly efficient solver implementations enable the application of max-satisfiability towards industrial sized circuits [1]. In terms of implementation, each logic equation for the entire circuit is translated into individual clauses, which are fed to a SAT solver, such as Chaff [2] for example, to check for satisfiability. The solved max-satisfiability problem ensures that for each latch that can switch simultaneously, its data input and its output state in the current cycle are of opposite logic states. For example, as shown in FIG. 3, when the clock net arrives at the latch, the latch output is forced to switch states.

Figure 4A:
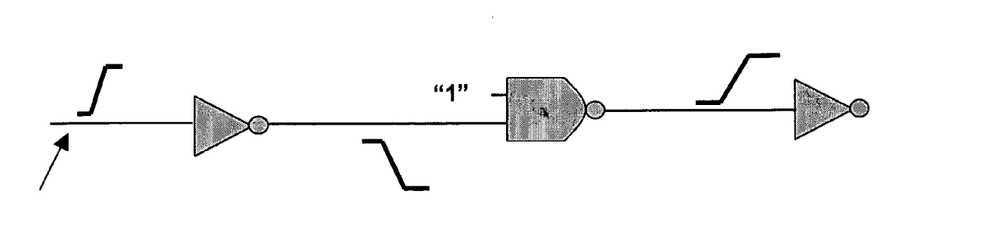
FIGS. 4(a) and 4(b) show an example of tracing and simulating an active clock net using channel-connected components.

Next, starting at the primary clock inputs, each active clock net is traced by first partitioning the clock net into channel-connected components (CCCs) and then sensitizing each CCC to propagate a switching input forward. The sensitization is performed using a binary decision diagram (BDD) to detect the possible paths from the power and ground rails of the CCC to its output. Solving the BDD sets the side inputs of the CCC to appropriate values to ensure propagation of the switching input to the CCC output. An example of sensitizing a CCC to propagate a switching input forward is illustrated in FIG. 4*a*, where a side input of the NAND gate is held to logic state "1" to allow the switching input to propagate forward.

Figure 4B:
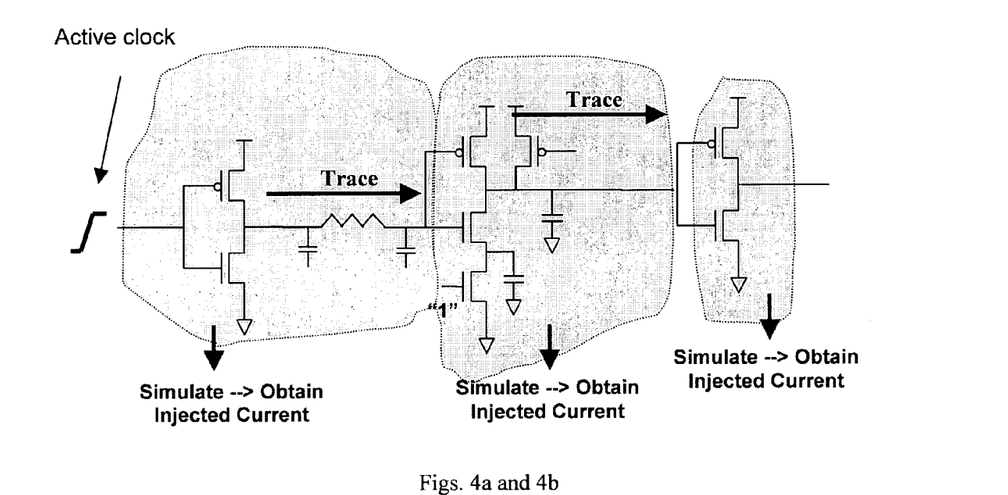

Once the tracing is completed, a simulation is performed on the traced CCCs, one by one, to determine the instantaneous current drawn when the switching input is propagated through it. The switching output waveform at the output of one CCC is used as the input stimulus to a subsequent CCC in the trace. The waveforms at the input pins of the traced clock nets are assumed known (and provided by the user). Note that a simulation ordering is enforced to ensure that in the case of a CCC with multiple switching inputs (as in the case for parallel clock drivers), the switching inputs waveforms of a CCC are determined before simulation of that CCC is performed. An example of the simulation methodology is illustrated in FIG. 4*b*.

In addition to simulating the clock net, each switching latch is also simulated with the traced waveform applied to the clock pin, and a fixed state (as determined by the max satisfiability solution) is applied to the data input to ensure that the output changes state. The latch simulation can be performed in multiple ways. For example, if the total number of latches is small, each latch can be simulated as a collection of CCCs during the clock net simulation. Alternatively, to save computational time, simulation of each unique latch cell can be done in a pre-characterization step whereby the latch is simulated under varying switching input slew and output load conditions. The power supply current waveforms drawn by the latch are stored and reused during clock net tracing and simulation.

In simulating the clock net(s) distribution and the subsequently activated latches, the simulation time (interval of time over which simulation is performed) is relatively short, being roughly equal to the clock skew from the primary clock input to the furthest latch from it. Since the simulation stops after each latch changes state, the switching latch output does not propagate through the combinational circuitry connected to it. However, even if switching the combinational circuitry does not affect the peak instantaneous current dissipation, it may still be helpful to capture the power supply current characteristics over the entire clock cycle. This would use an extra simulation to be performed for each cone of combinational logic between latches.

Capturing these characteristics may be accomplished by partitioning each cone of combinational logic into CCCs, applying the latch output switching waveforms as input stimuli to them, and propagating these switching waveforms through the CCCs. To simulate the combinational logic circuitry, note that no extra sensitization is necessary since the max satisfiability solution would have performed this task. However, simulation ordering is once again applied to ensure that the inputs to a CCC are known prior to propagating a switching input through a CCC.

As a byproduct of calculating the instantaneous power currents as described above, a transistor-level netlist of the traced circuitry (clock net, latches and combinational circuitry) is written out in a suitable syntax for a circuit simulator (such as, for example, SPICE or Spectre). Also, voltage sources are written for the switching stimuli connected to the primary inputs of the clock net(s) and for the static logic values applied at all other primary inputs as dictated by results of the max satisifiability solution. Furthermore, initial states are applied to the latch outputs using appropriate initial condition statements for the circuit simulator. As a validation step, a user can simulate the generated transistor-level netlist with his/her circuit simulator of choice, and validate accuracy of the calculated instantaneous power supply currents as described above.

Power Grid Response Calculation

Figure 5:
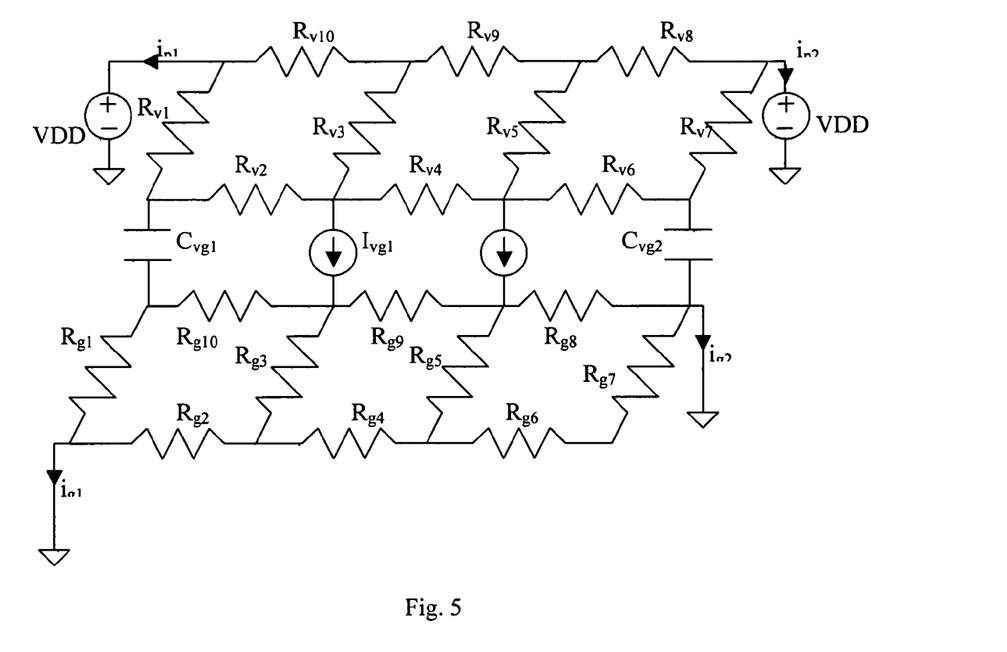
FIG. 5 shows an example of a power grid and ground grid network having resistors, capacitors, current and voltage sources.

The transient instance currents are injected into the power grid network, 130, comprising resistive and capacitive parasitics as shown in FIG. 5. The resistive parasitics arise from discretizing the metal power and ground interconnects into smaller segments whereas the capacitive parasitics arise from the overlap or fringe capacitance between these metal segments. Capacitance between power and ground segments due to non-switching gates, well junctions and explicit decoupling capacitors are also included in the power grid network. The power and ground networks are assumed to terminate with ideal voltage supplies. A technique to include parasitics associated with the off-chip interconnections and package is discussed below.

To solve the network of FIG. 5, Kirchhoff's Current Law (KCL) is applied to the nodes on the power grid and ground grid, resulting in the following equations:

$$G_v v_v + E_v C_{vg} \left( \frac{dv_{vc}}{dt} - \frac{dv_{gc}}{dt} \right) = -I_{vg} \quad (1)$$

$$G_g v_g + E_g C_{vg} \left( \frac{dv_{gc}}{dt} - \frac{dv_{vc}}{dt} \right) = I_{vg} \quad (2)$$

where $G_v$ is a N×N conductance matrix of the power grid, $G_g$ is a M×M conductance matrix of the ground grid, $v_v$, $v_g$ are the vectors of N power grid node voltages and M ground grid node voltages, $v_{vc}$, $v_{gc}$ are vectors of P power grid and ground grid node voltages that are coupled by capacitors and $C_{vg}$ is a P×P diagonal matrix representing these capacitors. Matrices $E_v$ and $E_g$ are matrices of size N×P and M×P respectively in which each column has a unit entry in the row corresponding to a capacitor connection and zero elsewhere. The voltage sources are not explicitly part of equations (1) or (2) since their contribution to the power grid response can be added to the power grid voltages, $v_v$ as a direct current (DC) term. At a time point of interest, t+Δt, the following equation is obtained from (1).

$$G_v v_v(t + \Delta t) + (E_v C_{vg} E_v^T) \frac{dv_v}{dt}(t + \Delta t) = \\ -G_v^{-1} I_{vg}(t + \Delta t) + E_v C_{vg} \frac{dv_{gc}}{dt}(t) \quad (3)$$

Note that in (3), the solution for the power grid node voltages is obtained by using the ground grid node voltage derivatives from the previous time point. This is equivalent to delaying the effect of the ground grid voltage by one time point. Similarly, the following equation is obtained from (2).

$$G_g v_g(t + \Delta t) + (E_g C_{vg} E_g^T) \frac{dv_g}{dt}(t + \Delta t) = \\ G_g^{-1} I_{vg}(t + \Delta t) + E_g C_{vg} \frac{dv_{vc}}{dt}(t) \quad (4)$$

To solve (3) and (4), a first order implicit integration algorithm is employed to yield the following equations:

$$v_v(t + \Delta t) = \left( G_v + \frac{E_v C_{vg} E_v^T}{\Delta t} \right)^{-1} \left[ -G_v^{-1} I_{vg}(t + \Delta t) + \\ E_v C_{vg} \frac{dv_{gc}}{dt}(t) + (E_v C_{vg} E_v^T) v_v(t) \right] \quad (5)$$

$$v_g(t + \Delta t) = \left( G_g + \frac{E_g C_{vg} E_g^T}{\Delta t} \right)^{-1} \left[ -G_g^{-1} I_{vg}(t + \Delta t) + \\ E_g C_{vg} \frac{dv_{vc}}{dt}(t) + (E_g C_{vg} E_g^T) v_g(t) \right] \quad (6)$$

The solutions to (5) and (6) are computationally dominated by the calculation of four matrix inversions, $G_v^{-1}$, $G_g^{-1}$, $(G_v + E_v C_{vg} E_v^T/\Delta t)^{-1}$ and $(G_g + E_g C_{vg} E_g^T/\Delta t)^{-1}$. Since the matrices, $G_v$ and $G_g$ are the same matrices used in the calculation of a static IR drop analysis, which may be run prior to a dynamic analysis, the inverse matrices $G_v^{-1}$ and $G_g^{-1}$ can be readily available to solve (5) and (6). Furthermore, for a given right hand side, b, it is possible to calculate the solutions $(G_v + E_v C_{vg} E_v^T/\Delta t)^{-1}.b$ and $(G_g + E_g C_{vg} E_g^T/\Delta t)^{-1}.b$ by applying P rank one updates to $Gv^{-1}.b$ and $Gg^{-1}.b$ respectively, since $C_{vg}$ is a diagonal matrix of rank P, (P<N; N=rank(G)). This is accomplished by repeated use of the Sherman Morrison formula on the matrix equation:

$$\left( G_v + \frac{E_v C_{vg} E_v^T}{\Delta t} \right) x = \left( G_v + \sum_{i=1}^{P} \frac{C_{ii}}{\Delta t} e_i e_i^T \right) x = b \quad (7)$$

where $e_i$ is a vector of size N with a unit entry at row i and zero everywhere else. The inverse of a rank one update of matrix, $G_v$ defined as:

$$(G_v + \alpha e_i e_i^T) x = b \quad (8)$$

which is solved by solving the two auxiliary problems $$G_v y = b \quad (9)$$

$$G_v z = \alpha e_i \quad (10)$$

for the vectors y and z. The solution is given in terms of these as:

$$x = y - \left[ \frac{e_i^T y}{(1 + e_i^T z)} \right] \cdot z \quad (11)$$

Note that the dot products $e_i^T y$ and $e_i^T z$ are equivalent to picking out the $i^{th}$ entry of vectors y and z respectively and hence equation (11) uses N floating point multiplications and N floating point subtractions. For P updates of rank one as is used in the solution of equation (7), one would need to solve equation (10) P times and equation (11) $(P^2+P)/2$ times. However, if the time step employed in the integration algorithm is fixed, the P solutions to (10) and $(P^2-P)/2$ solutions to (11) can be done only one time a priori and stored as P vectors of size N. Then, at every time step, the solution to (7) can be computed using P solutions of (11) requiring a total of N*P floating point operations.

Therefore, at every time step the solution to equation (5) can be obtained using two forward back substitutions using the matrix inverse, $G_v^{-1}$ requiring at most (N*N+1)/2 floating point operations (which may be much less owing to sparsity) and P rank one updates requiring N*P floating point operations. The solution to equation (6) is obtained likewise. Once the power and ground grid voltages are determined, the currents that flow into the pads (voltage sources), $i_p$, $i_{p2}$, $i_g$, $i_{g2}$ are determined by applying KCL at the corresponding pad nodes. This vector of short circuit currents, $i_{pgeq}$ is used in constructing an admittance macromodel of the power and ground grid network as described below.

Incorporating Effects of Off-Chip Parasitics

On an integrated circuit, the power and ground grids are connected through package and other off-chip parasitics to ideal board-level power supplies. Therefore, to predict on-chip dynamic power grid variations, the power and ground grid equations coupled with the package network equations are solved. To facilitate this solution, the power and ground pad nodes (connected to voltage sources) are defined as ports, and a macromodel of the coupled power and ground grid about the ports is constructed as follows:

$$(E \cdot i_{pg}) = Gv + C\frac{dv}{dt} + (E \cdot i_{pgeq}) \quad (12)$$

$$v_{pg} = E^T v \quad (13)$$

where $i_{pg}$ and $v_{pg}$ are the port current and voltage vectors of size p (p is the number of pads), and E is a n×p matrix (n=N+M) where each column has a unit entry in the row corresponding to a port and zero elsewhere. Furthermore the matrices G and C of size n×n are defined as follows:

$$G = \begin{bmatrix} G_v & 0 \\ 0 & G_g \end{bmatrix} C = \begin{bmatrix} E_v C_{vg} E_v^T & -E_v C_{vg} E_g^T \\ -E_g C_{vg} E_v^T & E_g C_{vg} E_g^T \end{bmatrix} \quad (14)$$

where the node voltage vector v is arranged as:

$$v = \begin{bmatrix} v_v \\ v_g \end{bmatrix} \quad (15)$$

and the matrix $E_v$, $E_g$ are the same matrices as defined in the previous section.

The current vector, $i_{pgeq}$ is the short circuit current flowing out of the pads as described in the previous section. In matrix form (12) and (13) are written as follows:

$$\begin{bmatrix} G+sC & -E \\ E^T & 0 \end{bmatrix} \begin{bmatrix} v \\ i_{pg} \end{bmatrix} = \begin{bmatrix} -E \cdot i_{pgeq} \\ v_{pg} \end{bmatrix} \quad (16)$$

To create a reduced order macromodel of (16), an orthonormal projection matrix, $V_q$ is determined using the block Arnoldi process [3]. The block Arnoldi process recursively produces an orthonormal basis for the Krylov subspace generated by the matrix $G^{-1}C$ and a starting block of vectors given by $G^{-1}E$. After k iterations, the block Arnoldi process produces an n×q matrix where q=k×p (p is the number of ports) and q<n:

$$V_q = [V_0 V_1 \ldots V_{k-1}] \quad (17)$$

whose columns form bases for the Krylov subspace generated by $G^{-1}C$ and $G^{-1}E$. i.e., $$\text{colsp}(V_q) = Kr(G^{-1}C, G^{-1}E, q) \quad (18)$$

Furthermore, its columns can be shown to be orthonormal. i.e., $$V_q^T V_q = I \quad (19)$$

The computational complexity of the block Arnoldi process is dominated by k solutions of the equation:

$$V_j = -G^{-1}CV_{j-1} \quad (20)$$

where $V_j$ is the jth column and $V_{j-1}$ the previous column of the matrix in (17). To calculate (20) quickly we exploit the block diagonal structure of the G and C matrix as follows:

$$\begin{bmatrix} v_{v,j} \\ v_{g,j} \end{bmatrix} = -\begin{bmatrix} G_v^{-1} & 0 \\ 0 & G_g^{-1} \end{bmatrix} \begin{bmatrix} E_v C_{vg} E_v^T & -E_v C_{vg} E_g^T \\ -E_g C_{vg} E_v^T & E_g C_{vg} E_g^T \end{bmatrix} \begin{bmatrix} V_{v,j-1} \\ V_{g,j-1} \end{bmatrix} \quad (21)$$

which leads to:

$$\begin{bmatrix} v_{v,j} \\ v_{g,j} \end{bmatrix} = \begin{bmatrix} G_v^{-1}(E_v C_{vg} E_g^T V_{g,j-1} - E_v C_{vg} E_v^T V_{v,j-1}) \\ G_g^{-1}(E_g C_{vg} E_v^T V_{v,j-1} - E_g C_{vg} E_g^T V_{g,j-1}) \end{bmatrix} \quad (22)$$

which in turn is calculated efficiently by exploiting the fact that inverse matrices $G_v^{-1}$ and $G_g^{-1}$ are readily available, $C_{vg}$ is a diagonal matrix and that application of the matrices $E_v$, $E_g$, $E_v^T$ and $E_g^T$ amounts to selecting the appropriate rows or columns of the subsequent matrix.

Once the projection matrix, $V_q$ is determined, it is appended with an identity matrix of size p such that the resulting matrix of size (n+p)×(q+p) projects the n+p equations of (16) to a matrix of q+p equations. The projection matrix is applied to (16) as follows:

$$\begin{bmatrix} V_q & 0 \\ 0 & I \end{bmatrix}^T \begin{bmatrix} G+sC & -E \\ E^T & 0 \end{bmatrix} \begin{bmatrix} v \\ i_{pg} \end{bmatrix} = \begin{bmatrix} V_q & 0 \\ 0 & I \end{bmatrix}^T \begin{bmatrix} -E \cdot i_{pgeq} \\ v_{pg} \end{bmatrix} \quad (23)$$

Next, defining, $$\begin{bmatrix} v \\ i_{pg} \end{bmatrix} = \begin{bmatrix} V_q & 0 \\ 0 & I \end{bmatrix} \begin{bmatrix} \hat{v} \\ i_{pg} \end{bmatrix} \quad (24)$$

provides a (q+p)×(q+p) matrix of equations as follows:

$$\begin{bmatrix} V_q^T(G+sC)V_q & -V_q^T E \\ E^T V_q & 0 \end{bmatrix} \begin{bmatrix} \hat{v} \\ i_{pg} \end{bmatrix} = \begin{bmatrix} -V_q^T E \cdot i_{pgeq} \\ v_{pg} \end{bmatrix} \quad (25)$$

In the time domain, the corresponding equations are:

$$V_q^T E \cdot i_{pg} = \hat{G}\hat{v} + \hat{C}\frac{d}{dt}\hat{v} + (V_q^T E \cdot i_{pgeq}) \quad (26)$$

$$v_{pg} = E^T V_q \cdot \hat{v} \quad (27)$$

$$\hat{G} = V_q^T G V_q \quad \hat{C} = V_q^T C V_q \quad (28)$$

which is a order q reduced order model of (12) and (13). The q order approximation guarantees that the first k=q/p block moments of the reduced order model and the original circuit model are the same.

At time t+Δt, applying a first order integration algorithm to (26), (27) results in the following equation describing the reduced order macromodel:

$$\begin{bmatrix} \hat{G} + \dfrac{\hat{C}}{\Delta t} & -V_q^T E \\ E^T V_q & 0 \end{bmatrix} \begin{bmatrix} \hat{v}(t+\Delta t) \\ i_{pg}(t+\Delta t) \end{bmatrix} = \begin{bmatrix} -V_q^T E \cdot i_{pgeq} + \dfrac{\hat{C}}{\Delta t} \hat{v}(t) \\ v_{pg}(t+\Delta t) \end{bmatrix} \quad (29)$$

For the off-chip parasitics, applying a time domain integration to the equations governing them results in:

$$-i_{pg}(t+\Delta t) = i_{\mathit{off}}(t+\Delta t) + Y_{\mathit{off}} v_{pg}(t+\Delta t) \quad (30)$$

where $i_{\mathit{off}}$ is the off-chip short circuit current vector and $Y_{\mathit{off}}$ the off-chip admittance matrix at the given time point. Solving (29) and (30) simultaneously results in the solution for $v_{pg}(t+\Delta t)$ and $\hat{v}(t+\Delta t)$.

The updates to power and ground grid voltages due to off-chip parasitics can then be calculated as:

$$v(t+\Delta t) = V_q \cdot \hat{v}(t+\Delta t) \quad (31)$$

By linear superposition, the final power and ground voltage response is obtained as the sum of the solutions of (5), (6) and (31).

Incorporating Effects of Lossy Capacitors

Figure 6:
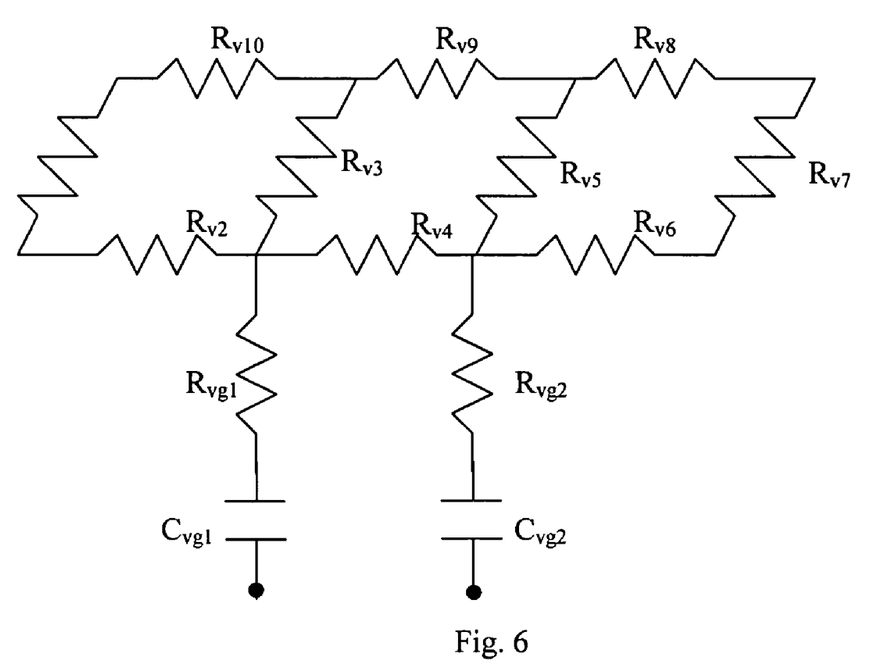
FIG. 6 shows an example of a power grid network having resistive loss from its decoupling capacitors.

Sometimes, a series resistance is added to a decoupling capacitor to better control the time constant with which it responds to switching current demand. Moreover, while modeling the decoupling effect of non-switching circuits, it is important to model the holding resistance of a non-switching circuit in series with the decoupling capacitor, as is illustrated in FIG. 6 for example.

To solve the network of FIG. 6, one could simply include the loss from resistors in the power grid network by defining an extended matrix, $G_v'$ as follows:

$$G_{v'} = \begin{bmatrix} G_v + E_v G_{vg} E_v^T & -E_v G_{vg} \\ -G_{vg} E_v^T & G_{vg} \end{bmatrix} \quad (32)$$

where $G_{vg}$ is a diagonal P×P matrix containing the loss resistors. For each matrix solution, $(G_v')^{-1} b$, the corresponding matrix equation is defined as follows.

$$\begin{bmatrix} G_v + E_v G_{vg} E_v^T & -E_v G_{vg} \\ -G_{vg} E_v^T & G_{vg} \end{bmatrix} \begin{bmatrix} v_N \\ v_P \end{bmatrix} = \begin{bmatrix} b_N \\ b_P \end{bmatrix} \quad (33)$$

Next, multiplying the second row of (32) by $E_v$ and adding to the first row results in:

$$\begin{bmatrix} G_v & 0 \\ -G_{vg} E_v^T & G_{vg} \end{bmatrix} \begin{bmatrix} v_N \\ v_P \end{bmatrix} = \begin{bmatrix} b_N + E_v b_P \\ b_P \end{bmatrix} \quad (34)$$

which is then solved as two equations.

$$v_N = G_v^{-1}(b_N + E_v b_P) \quad (35)$$

$$v_P = G_{vg}^{-1}(b_P + G_{vg} E_v^T v_N) \quad (36)$$

Note that (35) reuses the factorization of the original power grid matrix (i.e., excluding the loss resistors) and (36) requires a factorization of the diagonal P×P matrix, $G_{vg}$.

Using (35) and (36), the effect of loss resistors can be included in the dynamic power grid analysis with minimal computational overhead.

Top Instance Contributor Calculation

For each power/ground grid voltage node whose voltage response exceeds the preset tolerance level ("failed node"), it may be helpful to determine the top instance contributors to the failed node voltage response, 160. To reduce or minimize the voltage drop at the failed node, decoupling capacitance is added to the top contributing instances in order to provide local repositories of charge precisely where they are beneficial, 170. In order to compute the contributions, 160, the following equation is formulated:

$$z_i = (G + sC)^{-1} e_i \quad (32)$$

where i is the row number corresponding to the failed node in the vector of power and ground grid nodes, and $z_i$ represents the impedance from the failed node to all the power and ground grid nodes. By reciprocity, $$z_{ij} = e_j^T (G+sC)^{-1} e_i = e_i^T (G+sC)^{-1} e_j = z_{ji} \quad (33)$$

where $z_{ij}$ is the impedance from node i to node j.

Next, defining node i as a port and employing k iterations of the block Arnoldi process recursively produces an orthonormal basis, $V_k$ for the Krylov subspace generated by the matrix $G^{-1}C$ and a starting vector $G^{-1}e_i$. Note that the projection matrix $V_k$ has k columns (k<<n) owing to the fact that only a single port is defined and it is determined efficiently by exploiting the block diagonal structure of the G and C matrices. Applying the projection matrix to (32) results in:

$$z_i = V_k (\hat{G} + s\hat{C})^{-1} (V_k^T \cdot e_i) \quad (34)$$

$$\hat{G} = V_k^T G V_k, \hat{C} = V_k^T C V_k \quad (35)$$

where $\hat{G}$ and $\hat{C}$ are k×k matrices. The contributions of all the instance currents on the voltage response at node i can be expressed as:

$$v_i = z_i^T i = z_{i1} i_1 + z_{i2} i_2 + \ldots = e_i^T V_k (\hat{G} + s\hat{C})^{-1} V_k^T \begin{bmatrix} i_1 \\ i_2 \\ \ldots \end{bmatrix} \quad (36)$$

In the time domain this is calculated as:

$$\hat{v}(t+\Delta t) = \left(\hat{G} + \dfrac{\hat{C}}{\Delta t}\right)^{-1} \left(V_k^T (e_i \cdot i_j(t)) + \dfrac{\hat{C}}{\Delta t} \hat{v}(t)\right) \quad (37)$$

$$v_{ij}(t+\Delta t) = e_i^T V_k \cdot \hat{v}(t+\Delta t) \quad (38)$$

where $v_{ij} = z_{ij} i_j$ is the contribution of the $j^{th}$ instance current $i_j$ at node i.

Note that it is possible to diagonalize matrices $\hat{G}$ and $\hat{C}$ by employing a second projection on these matrices using the eigenvectors of $\hat{G}^{-1}\hat{C}$ as the projection matrix. Thus, at every time step, the solution to (37) and (38) requires just 4*k floating point operations.

Adding Decoupling Capacitors

Once the contribution waveform $v_{ij}$ at node i from each instance j is computed, the contributors are sorted by the peak magnitude of their contribution. Starting from the biggest instance contributor, decoupling capacitors are added 170 between power and ground rails of each of the top instance contributors until the magnitude of the voltage response at the failed node is below the predefined tolerance.

Figure 7:
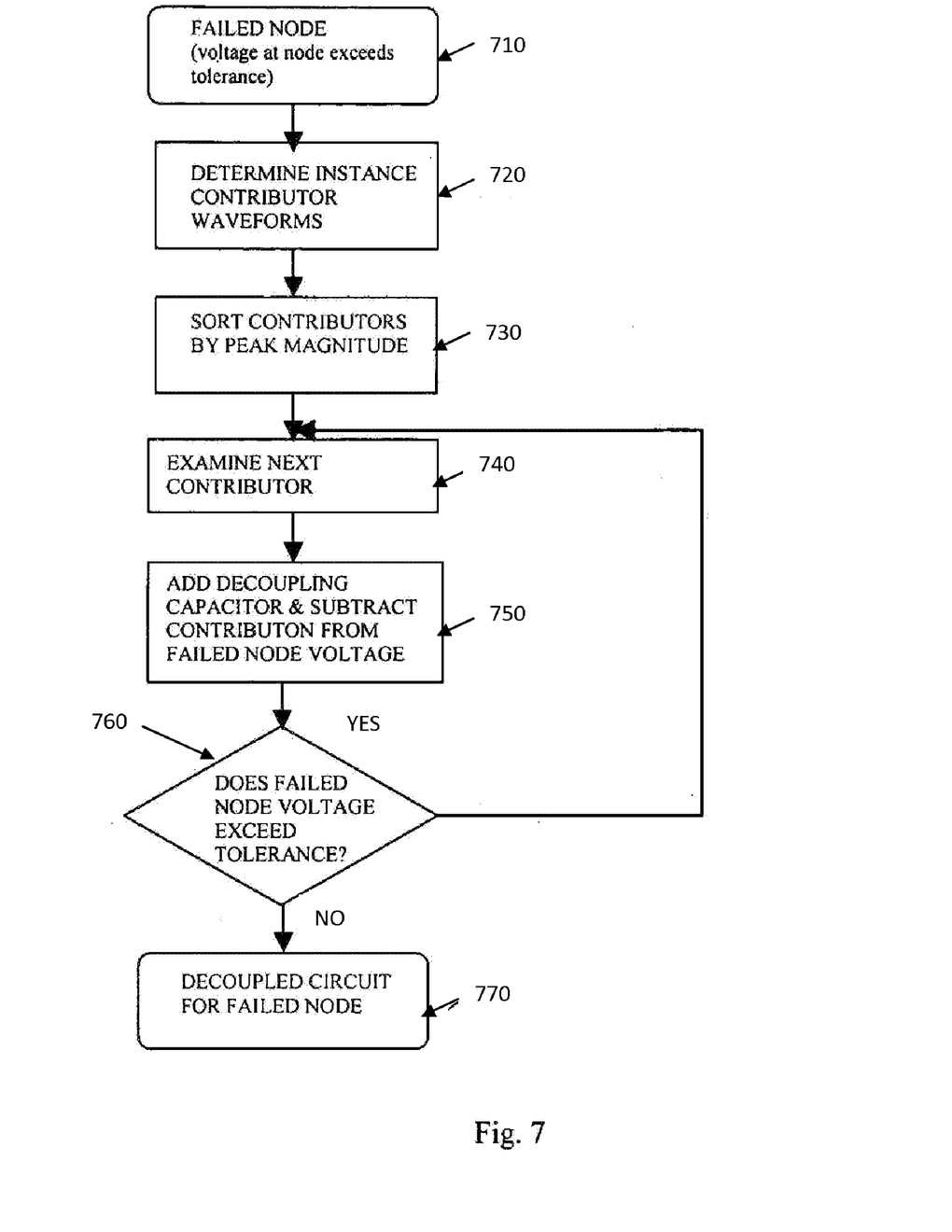
FIG. 7 shows an example of a method for adding decoupling capacitors to top contributors of a failed node.

For example, FIG. 7 shows an embodiment of a method for adding decoupling capacitors to top contributors of a failed node. The failed node is identified, 710. The waveforms of instances that contribute to the failed node are determined, 720. These contributors are sorted based on their peak magnitudes, 730. The sorted contributors are examined, beginning with the contributor having the highest peak magnitude, 740. A decoupling capacitor is added to the circuit design to alleviate the effects of the examined contributor, and the contributor's voltage contribution is subtracted from the voltage level of the failed node, 750. If the failed node's voltage still exceeds the tolerance amount, 760, the method returns to 740 to examine the next contributor in the sorted list. Otherwise, the method is completed for the failed node, 770.

The size of the decoupling capacitance for the $j^{th}$ instance contributor added during 750 is determined as:

$$C_d = \frac{1}{V_{dd}} \cdot \int_0^T i_j(t) dt = \frac{Q_d}{V_{dd}} \quad (39)$$

where the charge, $Q_d$ dissipated over one clock period, T as determined by integrating the instance current $i_j(t)$, is used to determine the size of capacitor required to provide it. Once the decoupling capacitors have been added for a failed node, and its response is deemed fixed, the newly added decoupling capacitors are included in the global capacitance matrix so that they are included in the analysis required to fix the next failed node.

Figure 8:
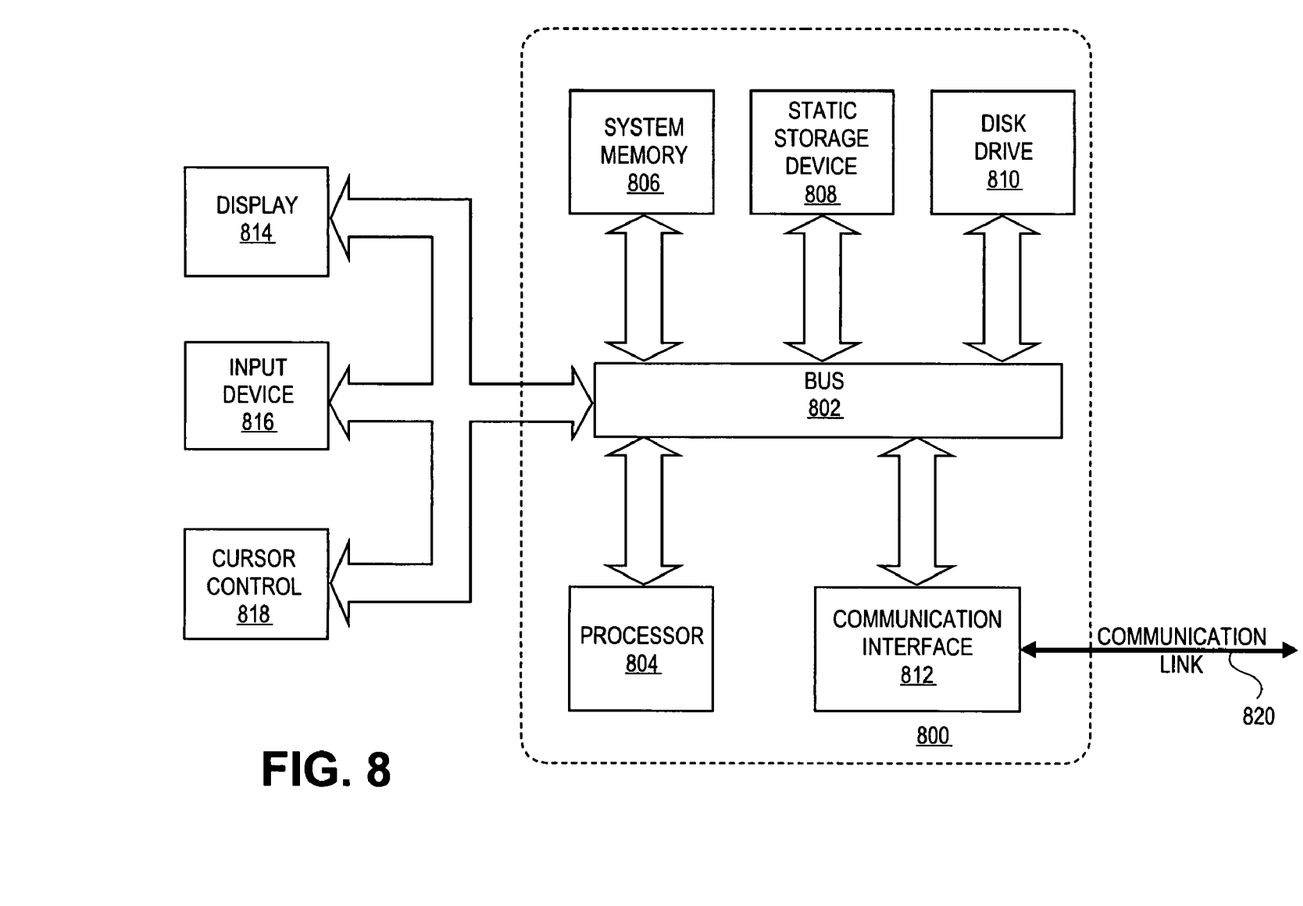
FIG. 8 is a block diagram of a computer system 800 suitable for implementing an embodiment of the present invention.

FIG. 8 is a block diagram of a computer system 800 suitable for implementing an embodiment of the present invention. Computer system 800 includes a bus 802 or other communication mechanism for communicating information, which interconnects subsystems and devices, such as processor 804, system memory 806 (e.g., RAM), static storage device 808 (e.g., ROM), disk drive 810 (e.g., magnetic or optical), communication interface 812 (e.g., modem or Ethernet card), display 814 (e.g., CRT or LCD), input device 816 (e.g., keyboard), and cursor control 818 (e.g., mouse or trackball).

According to one embodiment of the invention, computer system 800 performs specific operations by processor 804 executing one or more sequences of one or more instructions contained in system memory 806. Such instructions may be read into system memory 806 from another computer readable medium, such as static storage device 808 or disk drive 810. In alternative embodiments, hard-wired circuitry may be used in place of or in combination with software instructions to implement the invention.

The term "computer readable medium" as used herein refers to any medium that participates in providing instructions to processor 804 for execution. Such a medium may take many forms, including but not limited to, non-volatile media, volatile media, and transmission media. Non-volatile media includes, for example, optical or magnetic disks, such as disk drive 810. Volatile media includes dynamic memory, such as system memory 806. Transmission media includes coaxial cables, copper wire, and fiber optics, including wires that comprise bus 802. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 800. According to other embodiments of the invention, two or more computer systems 800 coupled by communication link 820 (e.g., LAN, PTSN, or wireless network) may perform the sequence of instructions required to practice the invention in coordination with one another.

Computer system 800 may transmit and receive messages, data, and instructions, including program, i.e., application code, through communication link 820 and communication interface 812. Received program code may be executed by processor 804 as it is received, and/or stored in disk drive 810, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of at least some of the described process actions may be changed without affecting the scope or operation of the invention. The specification and drawings are, accordingly, to be regarded in an illustrative rather than restrictive sense.

We claim:

1. A computer-implemented method for simulating an integrated circuit, comprising:
performing a dynamic power grid analysis of the circuit, wherein performing the dynamic power grid analysis further comprises:
determining a transient current drawn from a power supply of a power grid network by an instance of a logic gate of the circuit,
determining the transient current based at least in part upon an instantaneous current drawn from the power supply when the logic gate instances switch states;
identifying, by using a processor, an excessive dynamic power grid voltage fluctuation from the analysis, wherein identifying the excessive dynamic power grid voltage fluctuation further comprises:
injecting the determined transient current of the instance of the logic gate of the circuit into the power grid network of the circuit;
determining a response of at least one node of the power grid network to the transient current; and
identifying one or more nodes having an excessive voltage level in the response, wherein the excessive voltage level comprises a peak to peak power grid voltage that exceeds a tolerance level higher than a desired voltage level; modifying the circuit to reduce the excessive dynamic power grid fluctuation by reducing the excessive voltage level at the identified one or more nodes; and storing the circuit in a volatile or non-volatile computer readable medium or displaying the circuit on a display device.

2. The method of claim 1, wherein modifying the circuit further comprises:
determining a capacitance to add to the circuit to reduce the voltage level of each identified node.

3. The method of claim 2, further comprising:
determining one or more locations to place the capacitance.

4. The method of claim 2, wherein determining the capacitance to add to the circuit to reduce the voltage level of each identified node further comprises:

for each identified node, identifying one or more logic gate instances that contribute to the excessive voltage level at the node; and adding one or more decoupling capacitors to reduce the contributions from the identified instances.

5. The method of claim 4, wherein identifying one or more logic gate instances that contribute to the excessive voltage level at the node further comprises:

solving for $$v_{ij}(t+\Delta t) = c_i^T V_k \cdot \hat{v}(t+\Delta t)$$

where $v_{ij} = z_{ij} i_j$ is the contribution of the $j^{th}$ instance current $i_j$ at node i, and $e_i$ is a unit column vector with 1 in row i and 0 elsewhere.

6. The method of claim 4, wherein adding one or more decoupling capacitors further comprises:

solving for $$C_d = \frac{1}{V_{dd}} \cdot \int_0^T i_j(t) dt = \frac{Q_d}{V_{dd}}$$

where $Q_d$ is the charge dissipated over one clock period, T is the clock period, and $i_j(t)$ is the instance current, and $C_d$ is the size of capacitance to reduce the contributions.

7. The method of claim 1, wherein determining the transient current drawn from the power supply by the instance comprises:

determining a maximum instantaneous current drawn from the power supply when the logic gate instances switch states.

8. The method of claim 7, wherein determining the maximum instantaneous current further comprises:

for each clock net of the circuit, determining circuit conditions that result in a maximum number of outputs switching when a clock signal is asserted.

9. The method of claim 8, wherein determining circuit conditions further comprises:

determining Boolean logic for the circuit, the circuit having N nets, each net having a plurality of combinational logic gates and a fanin of F, the Boolean logic represented as:

$$x_i^P = f(x_{i1}^P, \ldots, x_{iF}^P)$$

$$x_i^N = f(x_{i1}^N, \ldots, x_{iF}^N)$$

where $x_i^P$ and $x_i^N$ refer to the Boolean variable of net i in the previous and next clock cycles respectively, $i_1, \ldots, i_F \in N$, and each variable is a logic function $f$ of its fanin;

representing a sequential logic transition between clock cycles as:

$$Q_i^N = D_j^P$$

where j=1, ..., S, and S is the total number of latches in the circuit, with D and Q being the input and output of the latch respectively; and determining an optimization criterion for the circuit, the optimization criterion represented as:

$$\underset{i=1}{\overset{N}{\text{MAX}}} \ [c_i * (x_i^P \ \text{XOR} \ x_i^N)]$$

where $c_i$ represents an optimization cost.

10. The method of claim 9, further comprising:
solving a satisfiability problem based on the Boolean logic and the optimization criterion.

11. The method of claim 8, further comprising:
tracing each clock net.

12. The method of claim 11, wherein tracing further comprises:
partitioning the clock net into channel-connected components; and
sensitizing each channel-connected component to propagate a switching input forward.

13. The method of claim 12, further comprising:
simulating each traced clock net to determine an instantaneous current drawn when the switching input is propagated forward.

14. The method of claim 11, further comprising:
tracing each switching latch; and
simulating the latches.

15. The method of claim 1, wherein determining the response of the at least one node of the power grid network to the transient currents further comprises:
determining a power voltage response of the at least one node.

16. The method of claim 15, wherein determining the power voltage response further comprises:
solving for $$v_v(t+\Delta t) =$$

$$\left(G_v + \frac{E_v C_{vg} E_v^T}{\Delta t}\right)^{-1} \left[-G_v^{-1} I_{vg}(t+\Delta t) + E_v C_{vg} \frac{dv_{gc}}{dt}(t) + (E_v C_{vg} E_v^T) v_v(t)\right]$$

where $v_v$ is a vector of power grid node voltages, $v_{gc}$ is a vector of ground grid node voltages that are coupled by capacitors, $G_v$ is a conductance matrix of the power grid, $E_v$ is a matrix in which each column has a unit entry in a row corresponding to a capacitor connection and zero elsewhere, and $C_{vg}$ is a diagonal matrix representing the capacitors.

17. The method of claim 1, wherein determining the response of the at least one node of the power grid network to the transient currents further comprises:
determining a ground voltage response of the at least one node.

18. The method of claim 17, wherein determining the ground voltage response comprises:
solving for $$v_g(t+\Delta t) =$$

$$\left(G_g + \frac{E_g C_{vg} E_g^T}{\Delta t}\right)^{-1} \left[-G_g^{-1} I_{vg}(t+\Delta t) + E_g C_{vg} \frac{dv_{vc}}{dt}(t) + (E_g C_{vg} E_g^T) v_g(t)\right]$$

where $v_g$ is a vector of ground grid node voltages, $v_{vc}$ is a vector power grid node voltages that are coupled by capacitors, $G_g$ is a conductance matrix of the ground grid, $E_g$ is a matrix in which each column has a unit entry in a row corresponding to a capacitor connection and zero elsewhere, and $C_{vg}$ is a diagonal matrix representing the capacitors.

19. An apparatus for simulating an integrated circuit, comprising:
a processor programmed for:
performing a dynamic power grid analysis of the circuit, wherein performing the dynamic power grid analysis further comprises:
determining a transient current drawn from a power supply of a power grid network by an instance of a logic gate of the circuit, determining the transient current based at least in part upon an instantaneous current drawn from the power supply when the logic gate instances switch states;

identifying an excessive dynamic power grid voltage fluctuation from the analysis, wherein the identifying the excessive dynamic power grid voltage fluctuation further comprises:
 injecting the determined transient current of the instance of the logic gate of the circuit into the power grid network of the circuit;
 determining a response of at least one node of the power grid network to the transient current; and
 identifying one or more nodes having an excessive voltage level in the response, wherein the excessive voltage level comprises a peak to peak power grid voltage that exceeds a tolerance level higher than a desired voltage level;

modifying the circuit to reduce the excessive dynamic power grid fluctuation by reducing the excessive voltage level at the identified one or more nodes; and a volatile or non-volatile computer readable medium storing the circuit or a display device for displaying the circuit.

20. The apparatus of claim 19, wherein performing the dynamic power grid analysis further comprises:
 determining Boolean logic for the circuit, the circuit having N nets, each net having a plurality of combinational logic gates and a fanin of F, the Boolean logic represented as:

$$x_i^P = f(x_{i1}^P, \ldots, x_{iF}^P)$$

$$x_i^N = f(x_{i1}^N, \ldots, x_{iF}^N)$$

where $x_i^P$ and $x_i^N$ refer to the Boolean variable of net i in the previous and next clock cycles respectively, $i_1, \ldots, i_F \in N$, and each variable is a logic function $f$ of its fanin;
 representing a sequential logic transition between clock cycles as:

$$Q_j^N = D_j^P$$

where $j=1, \ldots, S$, and S is the total number of latches in the circuit, with D and Q being the input and output of the latch respectively; and
 determining an optimization criterion for the circuit, the optimization criterion represented as:

$$\underset{i=1}{\overset{N}{\text{MAX}}} \; [c_i * (x_i^P \; XOR \; x_i^N)]$$

where $c_i$ represents an optimization cost.

21. The apparatus of claim 19, wherein determining the response of at least one node of the power grid network to the transient currents further comprises:
 solving for $$v_v(t + \Delta t) =$$

$$\left(G_v + \frac{E_v C_{vg} E_v^T}{\Delta t}\right)^{-1} \left[-G_v^{-1} I_{vg}(t + \Delta t) + E_v C_{vg} \frac{dv_{gc}}{dt}(t) + (E_v C_{vg} E_v^T) v_v(t)\right]$$

where $v_v$ is a vector of power grid node voltages, $v_{gc}$ is a vector of ground grid node voltages that are coupled by capacitors, $G_v$ is a conductance matrix of the power grid, $E_v$ is a matrix in which each column has a unit entry in a row corresponding to a capacitor connection and zero elsewhere, and $C_{vg}$ is a diagonal matrix representing the capacitors.

22. The apparatus of claim 19, wherein determining the response of at least one node of the power grid network to the transient currents further comprises:
 solving for $$v_g(t + \Delta t) =$$

$$\left(G_g + \frac{E_g C_{vg} E_g^T}{\Delta t}\right)^{-1} \left[-G_g^{-1} I_{vg}(t + \Delta t) + E_g C_{vg} \frac{dv_{vc}}{dt}(t) + (E_g C_{vg} E_g^T) v_g(t)\right]$$

where $v_g$ is a vector of ground grid node voltages, $v_{vc}$ is a vector power grid node voltages that are coupled by capacitors, $G_g$ is a conductance matrix of the ground grid, $E_g$ is a matrix in which each column has a unit entry in a row corresponding to a capacitor connection and zero elsewhere, and $C_{vg}$ is a diagonal matrix representing the capacitors.

23. The apparatus of claim 19, wherein modifying the circuit further comprises:
 solving for $$v_{ij}(t+\Delta t) = e_i^T V_k \cdot \hat{v}(t+\Delta t)$$

where $v_{ij} = z_{ij} i_j$ is the contribution of the $j^{th}$ instance current $i_j$ at node i, and $e_i$ is a unit column vector with 1 in row i and 0 elsewhere.

24. The apparatus of claim 19, wherein modifying the circuit further comprises:
 solving for $$C_d = \frac{1}{V_{dd}} \cdot \int_0^T i_j(t) dt = \frac{Q_d}{V_{dd}}$$

where $Q_d$ is the charge dissipated over one clock period, T is the clock period, and $i_j(t)$ is the instance current, and $C_d$ is the size of capacitance to reduce the contributions.

25. A volatile or non-volatile computer readable medium storing a computer program which, when executed by a processing system including a processor, causes the system to perform a method for simulating an integrated circuit, the method comprising:
 performing a dynamic power grid analysis of the circuit, wherein performing the dynamic power grid analysis further comprises:
 determining a transient current drawn from a power supply of a power grid network by an instance of a logic gate of the circuit, determining the transient current based at least in part upon an instantaneous current drawn from the power supply when the logic gate instances switch states;
 identifying an excessive dynamic power grid voltage fluctuation from the analysis,
 wherein the identifying the excessive dynamic power grid voltage fluctuation further comprises:
 injecting the determined transient current of the instance of the logic gate of the circuit into the power grid network of the circuit;
 determining a response of at least one node of the power grid network to the transient current; and
 identifying one or more nodes having an excessive voltage level in the response, wherein the excessive voltage level comprises a peak to peak power grid voltage that exceeds a tolerance level higher than a desired voltage level; modifying the circuit to reduce the excessive dynamic power grid fluctuation by reducing the excessive voltage level at the identified one or more nodes; and storing the circuit in or displaying the circuit on a display device.

26. The medium of claim 25, wherein performing the dynamic power grid analysis further comprises:
determining Boolean logic for the circuit, the circuit having N nets, each net having a plurality of combinational logic gates and a fanin of F, the Boolean logic represented as:

$$x_i^P = f(x_{i1}^P, \ldots, x_{iF}^P)$$

$$x_i^N = f(x_{i1}^N, \ldots, x_{iF}^N)$$

where $x_i^P$ and $x_i^N$ refer to the Boolean variable of net i in the previous and next clock cycles respectively, $i_1, \ldots, i_F \in N$, and each variable is a logic function $f$ of its fanin;
representing a sequential logic transition between clock cycles as:

$$Q_j^N = D_j^P$$

where $j=1, \ldots, S$, and S is the total number of latches in the circuit, with D and Q being the input and output of the latch respectively; and
determining an optimization criterion for the circuit, the optimization criterion represented as:

$$\underset{i=1}{\overset{N}{\text{MAX}}} \; [c_i * (x_i^P \; XOR \; x_i^N)]$$

where $c_i$ represents an optimization cost.

27. The medium of claim 25, wherein determining the response of at least one node of the power grid network to the transient currents further comprises:
solving for $$v_v(t+\Delta t) = \left(G_v + \frac{E_v C_{vg} E_v^T}{\Delta t}\right)^{-1} \left[-G_g^{-1} I_{vg}(t+\Delta t) + E_v C_{vg} \frac{dv_{gc}}{dt}(t) + (E_v C_{vg} E_v^T) v_v(t)\right]$$

where $v_v$ is a vector of power grid node voltages, $v_{gc}$ is a vector of ground grid node voltages that are coupled by capacitors, $G_v$ is a conductance matrix of the power grid, $E_v$ is a matrix in which each column has a unit entry in a row corresponding to a capacitor connection and zero elsewhere, and $C_{vg}$ is a diagonal matrix representing the capacitors.

28. The medium of claim 25, wherein determining the response of at least one node of the power grid network to the transient currents further comprises:
solving for $$v_g(t+\Delta t) = \left(G_g + \frac{E_g C_{vg} E_g^T}{\Delta t}\right)^{-1} \left[-G_g^{-1} I_{vg}(t+\Delta t) + E_g C_{vg} \frac{dv_{vc}}{dt}(t) + (E_g C_{vg} E_g^T) v_g(t)\right]$$

where $v_g$ is a vector of ground grid node voltages, $v_{vc}$ is a vector power grid node voltages that are coupled by capacitors, $G_g$ is a conductance matrix of the ground grid, $E_g$ is a matrix in which each column has a unit entry in a row corresponding to a capacitor connection and zero elsewhere, and $C_{vg}$ is a diagonal matrix representing the capacitors.

29. The medium of claim 25, wherein modifying the circuit further comprises:
solving for $$v_{ij}(t+\Delta t) = e_i^T V_k \cdot \hat{v}(t+\Delta t)$$

where $v_{ij} = z_{ij} i_j$ is the contribution of the $j^{th}$ instance current $i_j$ at node i, and $e_i$ is a unit column vector with 1 in row i and 0 elsewhere.

30. The medium of claim 25, wherein modifying the circuit further comprises:
solving for $$C_d = \frac{1}{V_{dd}} \cdot \int_0^T i_j(t) dt = \frac{Q_d}{V_{dd}}$$

where $Q_d$ is the charge dissipated over one clock period, T is the clock period, and $i_j(t)$ is the instance current, and $C_d$ is the size of capacitance to reduce the contributions.

* * * * *